(12) United States Patent
Imamura et al.

(10) Patent No.: US 8,283,103 B2
(45) Date of Patent: Oct. 9, 2012

(54) COMPOSITION FOR FORMING RESIST UNDERLAYER FILM FOR LITHOGRAPHY AND PRODUCTION METHOD OF SEMICONDUCTOR DEVICE

(75) Inventors: Hikaru Imamura, Toyama (JP); Yasushi Sakaida, Toyama (JP); Makoto Nakajima, Toyama (JP); Satoshi Takei, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 319 days.

(21) Appl. No.: 12/673,926

(22) PCT Filed: Aug. 26, 2008

(86) PCT No.: PCT/JP2008/065213
§ 371 (c)(1),
(2), (4) Date: Feb. 17, 2010

(87) PCT Pub. No.: WO2009/028511
PCT Pub. Date: Mar. 5, 2009

(65) Prior Publication Data
US 2011/0045404 A1 Feb. 24, 2011

(30) Foreign Application Priority Data
Aug. 27, 2007 (JP) .................................. 2007-220325

(51) Int. Cl.
*G03F 7/00* (2006.01)
*G03F 7/004* (2006.01)
*G03F 7/11* (2006.01)
*G03F 7/40* (2006.01)

(52) U.S. Cl. ............... 430/270.1; 430/272.1; 430/271.1; 430/322; 430/913; 430/330; 430/331

(58) Field of Classification Search ............... 430/270.1, 430/271.1, 273.1, 322, 913, 921, 927
See application file for complete search history.

(56) References Cited

U.S. PATENT DOCUMENTS

| | | | | |
|---|---|---|---|---|
| 4,761,464 A | * | 8/1988 | Zeigler | 528/30 |
| 4,820,788 A | * | 4/1989 | Zeigler | 528/33 |
| 6,025,117 A | * | 2/2000 | Nakano et al. | 430/314 |
| 6,552,143 B2 | * | 4/2003 | Funaki et al. | 526/271 |
| 7,198,886 B2 | * | 4/2007 | Sato et al. | 430/323 |
| 7,622,246 B2 | * | 11/2009 | Fedynyshyn | 430/325 |

FOREIGN PATENT DOCUMENTS

| | | |
|---|---|---|
| JP | A-11-60735 | 3/1999 |
| JP | A-2000-194128 | 7/2000 |
| JP | A-2001-93824 | 4/2001 |
| JP | A-2004-157469 | 6/2004 |
| JP | A-2004-309561 | 11/2004 |
| JP | A-2004-310019 | 11/2004 |
| JP | A-2005-15779 | 1/2005 |
| JP | A-2007-77198 | 3/2007 |
| WO | WO 2006/126406 A1 | 11/2006 |

OTHER PUBLICATIONS

Sep. 22, 2008 International Search Report issued in International Patent Application No. PCT/JP2008/065213.

* cited by examiner

*Primary Examiner* — Amanda C. Walke
(74) *Attorney, Agent, or Firm* — Oliff & Berridge, PLC

(57) ABSTRACT

There is provided a composition for forming a resist underlayer film that can be homogeneously applied and a sublimate is suppressed during the thermal curing. There is also provided a composition for forming a resist underlayer film having a high selection ratio of dry etching relative to a resist applied thereon. A composition for forming a resist underlayer film for lithography comprising: a polysilane compound having a unit structure of Formula (1):

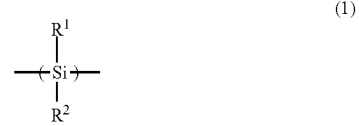

(where $R^1$ and $R^2$ are independently a group of —X—Y (where X is an oxygen atom, a $C_{1\text{-}18}$ alkylene group or a group of —$OC_nH_{2n}$— (where n is an integer of 1 to 18) and Y is a lactone ring or an adamantane ring), or one of $R^1$ and $R^2$ is the group of —X—Y and another thereof is an aryl group, a methyl group, an ethyl group or a $C_{3\text{-}6}$ cycloalkyl group); and an organic solvent.

11 Claims, No Drawings

COMPOSITION FOR FORMING RESIST UNDERLAYER FILM FOR LITHOGRAPHY AND PRODUCTION METHOD OF SEMICONDUCTOR DEVICE

TECHNICAL FIELD

The present invention relates to a composition for forming a resist underlayer film containing a polysilane compound, used in a lithography process in a production process of a semiconductor device, and useful as a resist underlayer film formed between a semiconductor substrate and a resist.

BACKGROUND ART

In recent years, corresponding to the enhancement of semiconductor elements in integration degree, the miniaturization of a pattern of wiring or the like is required. In order to form a fine pattern, a short-wavelength light such as an ArF excimer laser (wavelength: 193 nm) is adopted as a light source for exposure to form a resist pattern.

As the aspect ratio (height/width) of a resist pattern increases, a pattern collapse occurs more easily. In order to prevent the pattern collapse, the film thickness of a resist is necessary to be reduced. However, a resist pattern formed from a resist having a small film thickness may be lost while dry etching a material to be etched using the resist pattern as a mask. In order to prevent the pattern collapse and to form a resist pattern having a desired cross-sectional shape, a resist underlayer film is provided as a base of the resist pattern.

There is known a composition containing a polymer compound containing silicon for forming a resist underlayer film (for example, see Patent Documents 1 to 3). Patent Document 1 discloses two types of compositions for forming a resist underlayer film containing a hydrolysis condensate of an alkoxysilane. Patent Document 2 discloses a material for an anti-reflective coating that contains a polysiloxane having a repeating unit of a copolymerization. Patent Document 3 discloses a silicone resin for an anti-reflective coating, containing an organic group having a carbon-oxygen single bond and/or a carbon-oxygen double bond. However, in any one of Patent Documents 1 to 3, there is no description on a polysilane.

Patent Document 4 discloses a polysilane having excellent heat resistance and an enhanced solubility in a solvent and a production method thereof. However, Patent Document 4 does not indicate that the polysilane is suitable for the application of a resist underlayer film (anti-reflective coating).

[Patent Document 1]
Japanese Patent Application Publication No. JP-A-2004-157469
[Patent Document 2]
Japanese Patent Application Publication No. JP-A-2004-310019
[Patent Document 3]
Japanese Patent Application Publication No. JP-A-2005-015779
[Patent Document 4]
Japanese Patent Application Publication No. JP-A-2007-077198

DISCLOSURE OF THE INVENTION

Problems to be Solved by the Invention

A resist underlayer film formed from a polymer compound containing silicon has such a characteristic as having a high selection ratio of dry etching using a halogen-based gas such as $CF_4$ and $CHF_3$ relative to an organic resist. When the resist underlayer film is required to have characteristics as a hardmask, the content of silicon in the film is necessary to be increased.

Further, when applying a composition for forming a resist underlayer film on a substrate and curing the composition by heating to form a resist underlayer film, it is required that the composition can be homogeneously applied and a sublimate is not generated during the heating.

Means for Solving the Problems

The composition for forming a resist underlayer film according to the present invention is characterized by containing a polysilane compound into which a lactone ring or an adamantane ring is introduced. The polysilane compound is a polymer having Si—Si bonds in the backbone thereof and a lactone ring or an adamantane ring is introduced into side chains. The polysilane compound may have any one of a linear backbone and a branched backbone.

The present invention is a composition for forming a resist underlayer film for lithography containing a polysilane compound having a unit structure of Formula (1):

(where $R^1$ and $R^2$ are independently a group of —X—Y (where X is an oxygen atom, a $C_{1-18}$ alkylene group or a group of —$OC_nH_{2n}$— (where n is an integer of 1 to 18) and Y is a lactone ring or an adamantane ring), or
one of $R^1$ and $R^2$ is the group of —X—Y and another thereof is an aryl group, a methyl group, an ethyl group or a $C_{3-6}$ cycloalkyl group) and an organic solvent.

The $C_{1-18}$ alkylene group is, for example, a $C_2$ alkylene group, and the integer of 1 to 18 is, for example, 1 or 2.

In one aspect of the present invention, the unit structure of Formula (1) is a unit structure of Formula (1a):

(where $R^1$ is an aryl group, a methyl group, an ethyl group or a $C_{3-6}$ cycloalkyl group; X is an oxygen atom, a $C_{1-18}$ alkylene group or a group of —$OC_nH_{2n}$— (where n is an integer of 1 to 18); and Y is a lactone ring or an adamantane ring).

The polysilane compound may further have a unit structure of Formula (2) and/or Formula (3):

-continued (3)

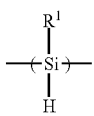

(where $R^3$ is an aryl group, a methyl group, an ethyl group or a $C_{3-6}$ cycloalkyl group; and $R^1$ is the same as that defined in Formula (1a)).

When the total sum of unit structures that a polysilane compound contained in the composition for forming a resist underlayer film of the present invention has is assumed to be 100%, the ratio of the unit structure of Formula (1a) is in a range of 1 to 100%; the ratio of the unit structure of Formula (2) is in a range of 0 to 90%; and the ratio of the unit structure of Formula (3) is in a range of 0 to 99%. That is, the unit structures of Formula (2) and Formula (3) are not essential and the content(s) of one or both of the unit structures of Formula (2) and Formula (3) may be 0%.

The polysilane compound may further have a unit structure of Formula (4):

(4)

The polysilane compound may have a hydrogen atom at a terminal thereof.

In addition, the polysilane compound may also have a silanol group at a terminal thereof.

The polysilane compound having the unit structure of Formula (1a) can be obtained by reacting a polysilane compound having a unit structure of Formula (5):

(5)

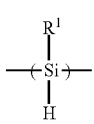

(where $R^1$ is the same as that defined in Formula (1a))
with a compound of Formula: Y—OH, Formula: Y—$C_nH_{2n}$OH or Formula: —Y—CH=CH$_2$ (where Y is a lactone ring or an adamantane ring; and n is an integer of 1 to 18).

The integer of 1 to 18 is, for example, 1 or 2.

When $R^1$ is a hydrogen atom in the unit structure of Formula (5), a polysilane compound having the unit structure of Formula (1) (here, $R^1$ and $R^2$ are the groups of —X—Y) is obtained.

The polysilane compound having the unit structure of Formula (1a) and the unit structure(s) of Formula (2) and/or (3) is obtained by reacting a polysilane compound having unit structures of Formula (6) and Formula (7):

(6)

(7)

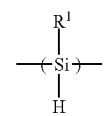

(where $R^1$ is the same as that defined in Formula (2); and $R^3$ is the same as that defined in Formula (3))
with a compound of Formula: Y—OH, Formula: Y—$C_nH_{2n}$OH or Formula: —Y—CH=CH$_2$ (where Y is a lactone ring or an adamantane ring; and n is an integer of 1 to 18).

The integer of 1 to 18 is, for example, 1 or 2.

The molar ratio of the unit structure of Formula (6): the unit structure of Formula (7) is, for example, in a range of 90:10 to 50:50 or a range of 75:25 to 50:50. The weight average molecular weight measured by gel permeation chromatography (GPC) of a polysilane compound having at least the unit structure of Formula (5) or unit structures of Formula (6) and Formula (7) is, for example, in a range of 1,000 to 15,000 or 1,000 to 10,000.

In unit structures of the above Formulae, examples of the aryl group include a phenyl group, a naphthyl group and an anthracenyl group, and examples of the lactone ring include a 4-membered ring, a 5-membered ring and a 6-membered ring.

A resist formed on a resist underlayer film obtained from the composition for forming a resist underlayer film of the present invention may be any one of a positive-type resist and a negative-type resist. A chemical amplification-type resist sensitive to a KrF excimer laser, an ArF excimer laser, EUV (extreme ultraviolet rays) or electron rays can also be used.

The composition for forming a resist underlayer film according to the present invention contains preferably a predetermined solvent. Examples of the solvent include organic solvents such as propylene glycol monomethyl ether acetate (PGMEA), propylene glycol monomethyl ether (PGME), ethyl lactate, cyclohexanone, γ-butylolactone, acetylacetone, toluene, 4-methyl-2-pentanol, propylene glycol n-butyl ether, propylene glycol phenyl ether, dipropylene glycol n-propyl ether, dipropylene glycol n-butyl ether, tripropylene glycol methyl ether and cyclohexanol. When a component remaining after subtracting a solvent from the composition for forming a resist underlayer film of the present invention is regarded as a solid content, the ratio of the solid content in the composition is, for example, 1 to 30% by mass or 1 to 10% by mass.

A crosslinker may be added to the composition for forming a resist underlayer film according to the present invention. Further, a crosslinking catalyst accelerating a crosslinking reaction may be added to the composition. The ratio of the crosslinker relative to the solid content can be, for example, 10% by mass or less and the ratio of the crosslinking catalyst relative to the solid content can be, for example, 3% by mass or less. Examples of the crosslinker include nitrogen-containing compounds such as hexamethoxymethylmelamine, tetramethoxymethylbenzoguanamine, tetramethoxymethylglycoluryl and 1,3-bis(hydroxymethyl) urea. Examples of the crosslinking catalyst include sulfonic acid compounds such as p-toluenesulfonic acid, trifluoromethanesulfonic acid, pyridinium-p-toluenesulfonic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid and pyridinium-1-naphthalenesulfonic acid.

By using an ammonium salt or a phosphonium salt as a crosslinking catalyst, the composition for forming a resist underlayer film according to the present invention can be cured to facilitate the formation of a resist underlayer film without blending the above crosslinker in the composition. Examples of the ammonium salt include quaternary ammonium salts such as benzyltriethylammonium chloride, benzyltrimethylammonium chloride, benzyltributylammonium chloride, tetramethylammonium chloride, tetraethylammonium bromide, tetraethylammonium chloride, tetrapropylammonium bromide, tetrabutylammonium bromide, tributylmethylammonium chloride, trioctylmethylammonium chloride and phenyltrimethylammonium chloride, and among them, for example benzyltriethylammonium chloride is selected. Examples of the phosphonium salt include quaternary phosphonium salts such as ethyltriphenylphosphonium bromide, ethyltriphenylphosphonium iodide, benzyltriphenylphosphonium chloride, butyltriphenylphosphonium bromide and tetrabutylphosphonium bromide, and among them, for example ethyltriphenylphosphonium bromide or tetrabutylphosphonium bromide is selected. The ratio of the quaternary ammonium salt or the quaternary phosphonium salt relative to the solid content of the composition for forming a resist underlayer film according to the present invention can be, for example, 0.001 to 3% by mass or 0.005 to 0.1% by mass. When a silanol group is present in a polysilane compound, it is considered that the ammonium salt or the phosphonium salt accelerates the condensation of silanol groups with each other and consequently enhances the curing property.

The composition for forming a resist underlayer film according to the present invention may contain a surfactant in a ratio of, for example, 2% by mass or less relative to the solid content. A surfactant can enhance the applicability of the composition to a substrate and as the surfactant, for example, a nonionic surfactant or a fluorinated surfactant is used. In addition, the composition for forming a resist underlayer film of the present invention may contain an adhesion assistant in a ratio of, for example, 2% by mass or less relative to the solid content. The adhesion assistant can enhance the adhesion between a base and the resist underlayer film or between a resist and the resist underlayer film and can suppress the peeling of the resist during the development of the resist. Examples of the adhesion assistant include chlorosilanes, alkoxysilanes, silazanes, silanes and heterocyclic compounds. Further, if necessary, the composition may contain an acid generator, for example, in a ratio of 1% by mass or less relative to the solid content. Examples of the acid generator include photoacid generators such as iodonium salt compounds and sulfonium salt compounds. By an acid generated from a photoacid generator, the acidity of the resist underlayer film surface can be controlled.

The above additive such as a crosslinker, a crosslinking catalyst, a surfactant, an adhesion assistant and a photoacid generator can be a cause of a sublimate generated during the formation of a resist underlayer film by thermal curing, so that when it is not necessary, the additive is not blended in the composition.

Another aspect of the present invention is a production method of a semiconductor device including: a process for forming an organic film on a semiconductor substrate; a process for forming a resist underlayer film by applying the composition for forming a resist underlayer film according to the present invention on the organic film and by curing the composition; a process for forming a resist pattern on the resist underlayer film; a process for etching the resist underlayer film using the resist pattern as a mask and using a halogen-based gas (for example, a gas containing $CF_4$ and/or $CHF_3$); and a process for etching the organic film using the resist underlayer film after the etching as a mask and using an oxygen-containing gas. The composition for forming a resist underlayer film according to the present invention can be used not only in the above method, but also for forming a hardmask provided under a resist pattern on a semiconductor substrate by using the composition in a double patterning process or a double exposing process.

As the semiconductor substrate, a representative semiconductor substrate is a silicon wafer, however, an SOI (Silicon on Insulator) substrate or a compound semiconductor wafer such as gallium arsenide (GaAs), indium phosphide (InP) and gallium phosphide (GaP) may be also used. The semiconductor device includes: a semiconductor element (a diode, a transistor, a memory and the like) produced using the above semiconductor substrate; and electronic equipment (a mobile phone, a television set, a personal computer or the like) produced using the semiconductor element.

EFFECTS OF THE INVENTION

A resist underlayer film formed from the composition for forming a resist underlayer film according to the present invention can have a higher silicon content than that of a resist underlayer film formed from a composition containing a polysiloxane compound into which a lactone ring or an adamantane ring is introduced. By increasing the silicon content of the resist underlayer film, dry etching resistance relative to an oxygen-containing gas is enhanced, and thus the resist underlayer film can be used more easily as a hardmask.

The resist underlayer film formed from the composition for forming a resist underlayer film according to the present invention enhances resistance of a developer for the resist. Therefore, while developing the resist, the resist underlayer film remains without being reacted with the developer.

Further, the composition for forming a resist underlayer film according to the present invention can be homogeneously applied and can be cured without blending a crosslinker in the composition. When a polysilane compound contained in the composition for forming a resist underlayer film has a crosslinking site such as a hydroxyl group, for example a silanol group, the compound is cured by a condensation of silanol groups with each other. Therefore, the composition for forming a resist underlayer film according to the present invention can suppress the generation of a sublimate during the thermal curing due to an additive. Here, a silanol group exhibits hydrophilicity and is expressed also as a hydroxyl group bonded to a silicon atom. The silanol group is capped with a trimethylsilyl group and disappears. More specifically, the silanol group (Si—OH) is reacted with hexamethyldisilazane (HMDS) to be converted into Si—O—Si(Me)$_3$ (Me is a methyl group) exhibiting hydrophobicity. By utilizing this phenomenon, the presence of the silanol group can be clarified. Further, by analyzing the composition using a Fourier-transform-near infrared (FT-NIR) spectrophotometer, the presence of the silanol group can be estimated.

Moreover, the resist underlayer film formed from the composition for forming a resist underlayer film according to the present invention is expected to enhance the adhesion thereof with a polymer-containing resist into which at least any one of an adamantane ring and a lactone ring is introduced, for example, a resist for an ArF excimer laser.

BEST MODES FOR CARRYING OUT THE INVENTION

Specific examples of the unit structure of a polysilane compound contained in the composition for forming a resist underlayer film according to the present invention are shown as Formulae (8) to (20). However, the unit structure of the polysilane compound is not limited to the following examples.
(8)
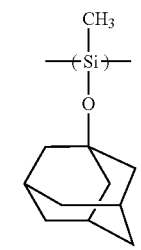
(9)
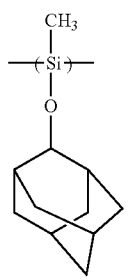
(10)
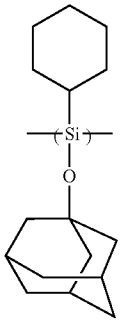
(11)
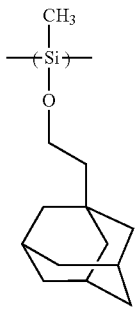
(12)
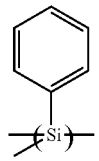
(13)
(14)
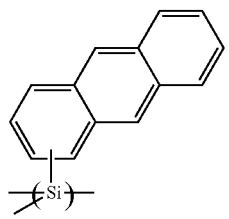
(15)
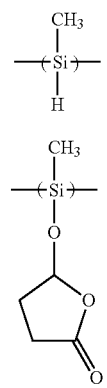
(16)
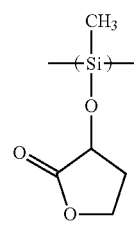
(17)
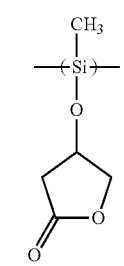
(18)
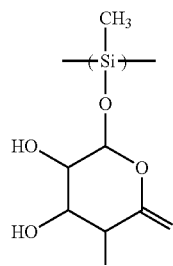
(19)
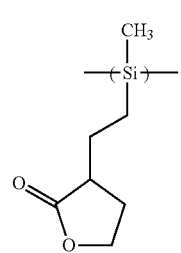
(20)
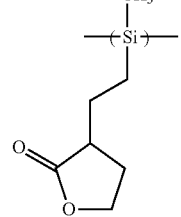

A polysilane compound having a unit structure of Formula (8) is obtained by using nickel chloride as a catalyst according to Reaction Formula (21):

(21)

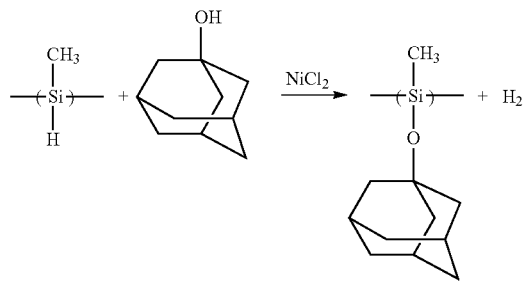

In this reaction, hydrogen is generated as a by-product. Here, by using 2-adamantanol instead of 1-adamantanol, polysilane having a unit structure of Formula (9) is obtained.

A polysilane compound having a unit structure of Formula (11) is obtained according to Reaction Formula (22):

(22)

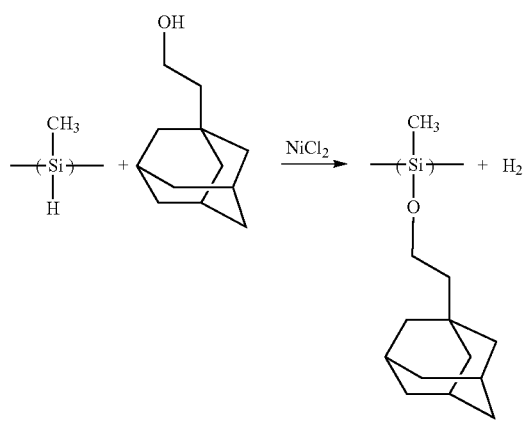

The alkylene group between the adamantane ring and the oxygen atom is not limited to an ethylene group as shown in Reaction Formula (22) and may also be, for example, an methylene group.

In addition, when a hydroxylactone of 5-membered ring is used instead of 1-adamantanol or 2-adamantanol, a polysilane compound having a unit structure of Formula (16), Formula (17) or Formula (18) is obtained. At this time, hydrogen is generated as a by-product. For example, a polysilane compound having the unit structure of Formula (17) is obtained according to Reaction Formula (23):

(23)

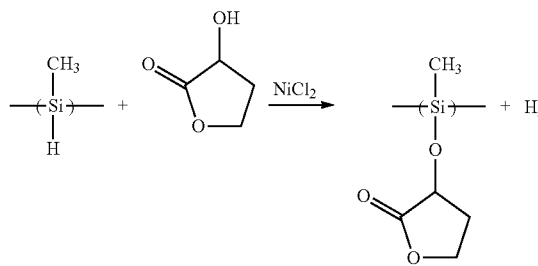

Even when the hydroxylactone is a 4-membered ring or a 6-membered ring, according to substantially the same reaction as the reaction of Reaction Formula (23), a polysilane compound having a unit structure into which a lactone of 4-membered ring or 6-membered ring is introduced can be obtained. When using a lactone substituted with a plurality of hydroxyl groups, by reacting a polysilane compound with a hydroxyl group having the highest reactivity, that is, a primary hydroxyl group, for example a polysilane compound having a unit structure of Formula (19) is obtained.

A polysilane compound having a unit structure of Formula (20) is obtained, for example according to Reaction Formula (24):

(24)

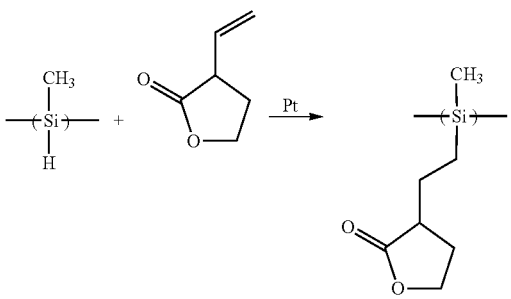

By applying Reaction Formula (24), there is obtained a polysilane compound having either a unit structure in which a lactone ring of the unit structure of Formula (20) is replaced by a 4-membered ring or a 6-membered ring, or a unit structure in which the lactone ring is replaced by an adamantane ring.

The unit structure of Formula (15) is a unit structure remaining unreacted because a reaction of Reaction Formulae (21) to (24) has not been progressed. The unit structures of Formulae (12) to (14) are an unreacted unit structure into which a lactone ring or an adamantane ring is not introduced.

The present invention will be described in more detail referring to Examples, which should not be construed as limiting the scope of the present invention.

EXAMPLES

Synthesis Example 1

There was prepared a toluene solution containing in a concentration of 10% by mass, a polysilane compound (trade name: SI-2030; manufactured by Osaka Gas Chemicals Co., Ltd.; weight average molecular weight: 2,200, number average molecular weight: 1,400) having unit structures of Formula (6a) and Formula (7a):

(6a)

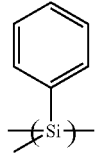

(7a)

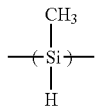

and having a silanol group, a hydrogen atom and a chlorine atom at a molecule terminal thereof. The chlorine atom at the terminal is an impurity derived from a raw material during the polysilane synthesis. To 20.00 g of the toluene solution, 2.04 g of 1-adamantanol (manufactured by Tokyo Chemical Industry Co., Ltd.) and 0.40 g of nickel chloride were added and the resultant mixture was stirred at room temperature for 17 hours. Subsequently, nickel chloride was removed from the mixture by filtration and the solvent (toluene) was distilled off under reduced pressure to subject the resultant residue to vacuum-drying at 80° C. for 10 hours. The yield amount was 2.36 g. The introduced amount of the adamantane ring in the obtained polymer was 15% by mass, relative to 100% by mass of the raw material polysilane compound before the reaction with 1-adamantanol.

Synthesis Example 2

To 20.00 g of a toluene solution containing the polysilane compound (trade name: SI-2030; manufactured by Osaka Gas Chemicals Co., Ltd.; weight average molecular weight: 2,200, number average molecular weight: 1,400) shown in Synthesis Example 1 in a concentration of 10% by mass, 1.37 g of α-hydroxy-γ-butylolactone and 0.34 g of nickel chloride were added and the resultant mixture was stirred at room temperature for 17 hours. Subsequently, nickel chloride was removed from the mixture by filtration and the solvent (toluene) was distilled off under reduced pressure to subject the resultant residue to vacuum-drying at 80° C. for 10 hours. The yield amount was 2.48 g. The introduced amount of the 5-membered ring lactone in the obtained polymer was 19% by mass, relative to 100% by mass of the raw material polysilane compound before the reaction with α-hydroxy-γ-butylolactone.

Example 1

To 0.40 g of the polymer obtained in Synthesis Example 1, 9.60 g of propylene glycol monomethyl ether acetate was added to prepare a 4.0% by mass solution of the polymer. Then, the solution was filtered using a polyethylene microfilter having a pore diameter of 0.1 μm to prepare a solution that is a composition for forming a resist underlayer film.

Example 2

To 0.40 g of the polymer obtained in Synthesis Example 2, 9.60 g of propylene glycol monomethyl ether acetate was added to prepare a 4.0% by mass solution of the polymer. Then, the solution was filtered using a polyethylene microfilter having a pore diameter of 0.1 μm to prepare a solution that is a composition for forming a resist underlayer film.

Comparative Example 1

To 0.36 g of the polysilane compound (trade name: SI-2030; manufactured by Osaka Gas Chemicals Co., Ltd.; weight average molecular weight: 2,200, number average molecular weight: 1,400) shown in Synthesis Example 1, 0.04 g of 1-adamantanol (manufactured by Tokyo Chemical Industry Co., Ltd.) and 9.60 g of propylene glycol monomethyl ether acetate were added to prepare a 4.0% by mass solution of the compound. Then, the solution was filtered using a polyethylene microfilter having a pore diameter of 0.1 μm to prepare a solution that is a composition for forming a resist underlayer film. The composition for forming a resist underlayer film of the present Comparative Example differs from that of Example 1 in that an adamantine ring is not introduced into the polymer (polysilane compound).

Comparative Example 2

To 0.36 g of the polysilane compound (trade name: SI-2030; manufactured by Osaka Gas Chemicals Co., Ltd.; weight average molecular weight: 2,200, number average molecular weight: 1,400) shown in Synthesis Example 1, 0.04 g of α-hydroxy-γ-butylolactone, 2.88 g of propylene glycol monomethyl ether and 6.72 g of propylene glycol monomethyl ether acetate were added to prepare a 4.0% by mass solution of the compound. Then, the solution was filtered using a polyethylene microfilter having a pore diameter of 0.1 μm to prepare a solution that is a composition for forming a resist underlayer film. The composition for forming a resist underlayer film of the present Comparative Example differs from that of Example 2 in that a lactone ring is not introduced into the polymer (polysilane compound).

(Dissolution Test in Photoresist Solvent, etc.)

Each of the compositions for forming a resist underlayer film (solutions) obtained in Example 1 and Example 2 was applied on a silicon wafer by a spinner. Each solution applied on the silicon wafer was baked on a hot plate at 270° C. for 7 minutes to form a resist underlayer film (film thickness: 90 nm) corresponding to each Example. Each resist underlayer film was immersed in propylene glycol monomethyl ether acetate and propylene glycol monomethyl ether that are solvents used for a photoresist composition, and was confirmed to be insoluble in these solvents. Further, the resist underlayer film was found to be insoluble in a generally used alkali developer such as 2.38% by mass tetramethylammonium hydroxide (TMAH).

(Measurement of Optical Parameters)

Using each of the compositions for forming a resist underlayer film obtained in Example 1 and Example 2, by substantially the same method as the above resist underlayer film forming method, a resist underlayer film (film thickness: 40 nm) corresponding to each Example was formed on a silicon wafer. Then, the refractive index (n value) and the attenuation coefficient (k value) of each underlayer film at a wavelength of 193 nm were measured with a spectroscopic elipsometer. The measurement results are shown in Table 1.

TABLE 1

|  | n value | k value |
| --- | --- | --- |
| Example 1 | 1.64 | 0.91 |
| Example 2 | 1.65 | 0.90 |

(Test of Dry Etching Rate)

Using each of the compositions for forming a resist underlayer film obtained in Example 1 and Example 2, by substantially the same method as the above resist underlayer film forming method, a resist underlayer film (film thickness: 90 nm) corresponding to each Example was formed on a silicon wafer. Then, the dry etching rate (reduced amount of film thickness per unit time (nm/sec)) was measured using the RIE system ES401 (manufactured by Nippon Scientific Co., Ltd.) and PC-1000 (manufactured by SAMCO Inc.) under a condition of using as a dry etching gas, tetrafluoromethane ($CF_4$) and oxygen ($O_2$) respectively. The measurement results are shown in Table 2. The selection ratio shown in Table 2 indicates the dry etching rate of a resist underlayer film formed from the composition for forming a resist underlayer film of each Example when the dry etching rate of the photoresist (trade name: GARS8105G1; manufactured by FUJIFILM Electronic Materials Co., Ltd. (former FUJIFILM Arch Co., Ltd.)) is assumed to be 1.0.

TABLE 2

|  | CF$_4$ Selection ratio | O$_2$ Selection ratio |
|---|---|---|
| Example 1 | 1.4 | 0.05 |
| Example 2 | 1.4 | 0.06 |

The result shown in Table 2 indicates the followings. Resist underlayer films formed from the compositions for forming a resist underlayer film obtained in Example 1 and Example 2 have a high dry etching rate that is one or more time(s) the dry etching rate of the resist under a condition of CF$_4$ gas used during the etching.

Further, the resist underlayer films have a dry etching rate far smaller than one time the dry etching rate of the resist under a condition of O$_2$ (oxygen) gas used during the etching of an organic film (called as an SOC film) formed under the resist underlayer film, and thus have advantageous hardmask characteristics.

(Test of Applying on Silicon Wafer)

When each of the compositions for forming a resist underlayer film obtained in Comparative Example 1 and Comparative Example 2 was applied on a silicon wafer by a spinner, in Comparative Example 2, an application unevenness was caused, so that a homogeneous film was unable to be formed. In addition, in Comparative Example 1, during the baking at 270° C. on a hot plate for 7 minutes, 1-adamantanol was sublimed and did not remain in the formed resist underlayer film. On the other hand, in the case of the compositions for forming a resist underlayer film obtained in Example 1 and Example 2, the above problems did not occur.

(Production of Semiconductor Device)

A publicly known SOC film is formed on a silicon wafer and the composition (solution) for forming a resist underlayer film obtained in Example 1 or Example 2 is applied on the SOC film by a spinner. Subsequently, by baking the solution applied on the SOC film on a hot plate maintained at a temperature of 270° C. for 7 minutes, the solution is cured to form a resist underlayer film. On the formed resist underlayer film, a resist pattern is formed using a publicly known positive-type or negative-type photoresist (such as chemical amplification-type photoresist) through a publicly-known process. Then, using the resist pattern as a mask, the resist underlayer film is dry etched using an etching gas containing CF$_4$. In the resist underlayer film after the etching, a resist pattern is transferred. Using the resist underlayer film as a mask, the SOC film is etched using an etching gas containing oxygen. In this step, the resist pattern is removed and patterns of the resist underlayer film and the SOC film are formed on the silicon wafer.

Continuously through a publicly known process, various semiconductor devices can be produced. Here, in the finally produced semiconductor device, the pattern of the SOC film is removed.

The invention claimed is:

1. A composition for forming a resist underlayer film for lithography comprising:

a polysilane compound having a unit structure of Formula (1a):

(where R$^1$ is an aryl group, a methyl group, an ethyl group or a C$_{3-6}$ cycloalkyl group; X is an oxygen atom, a C$_{1-18}$ alkylene group or a group of —OC$_n$H$_{2n}$— where n is an integer of 1 to 18; and Y is a lactone ring or an adamantane ring); and an organic solvent.

2. The composition for forming a resist underlayer film for lithography according to claim 1, wherein the polysilane compound further has a unit structure of Formula (2) and/or Formula (3):

(where R$^3$ is an aryl group, a methyl group, an ethyl group or a C$_{3-6}$ cycloalkyl group; and R$^1$ is an aryl group, a methyl group, an ethyl group or a C$_{3-6}$ cycloalkyl group).

3. The composition for forming a resist underlayer film for lithography according to claim 1, wherein the polysilane compound further has a unit structure of Formula (4):

4. The composition for forming a resist underlayer film for lithography according to claim 1, wherein the polysilane compound has a hydrogen atom at a terminal thereof.

5. The composition for forming a resist underlayer film for lithography according to claim 1, wherein the polysilane compound has a silanol group at a terminal thereof.

6. The composition for forming a resist underlayer film for lithography according to claim 1, wherein the polysilane compound is a polymer obtained by reacting a polysilane compound having a unit structure of Formula (5):

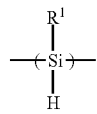
(5)

(where $R^1$ is an aryl group, a methyl group, an ethyl group or a $C_{3-6}$ cycloalkyl group) with a compound of Formula: Y—OH, Formula: Y—$C_nH_{2n}$OH or Formula: Y—CH=$CH_2$ (where Y is a lactone ring or an adamantane ring; and n is an integer of 1 to 18).

7. The composition for forming a resist underlayer film for lithography according to claim 2, wherein the polysilane compound is a polymer obtained by reacting a polysilane compound having unit structures of Formula (6) and Formula (7):

(6)

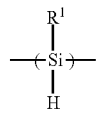
(7)

(where $R^3$ is an aryl group, a methyl group, an ethyl group or a $C_{3-6}$ cycloalkyl group; and $R^1$ is an aryl group, a methyl group, an ethyl group or a $C_{3-6}$ cycloalkyl group) with a compound of Formula: Y—OH, Formula: Y—$C_nH_{2n}$OH or Formula: Y—CH=$CH_2$ (where Y is a lactone ring or an adamantane ring; and n is an integer of 1 to 18).

8. The composition for forming a resist underlayer film for lithography according to claim 1, wherein the aryl group is a phenyl group, a naphthyl group or an anthracenyl group.

9. The composition for forming a resist underlayer film for lithography according to claim 1, wherein the lactone ring is a 4-membered ring, a 5-membered ring or a 6-membered ring.

10. The composition for forming a resist underlayer film for lithography according to claim 1, further comprising a quaternary ammonium salt or a quaternary phosphonium salt.

11. A production method of a semiconductor device comprising:
   forming an organic film on a semiconductor substrate;
   forming a resist underlayer film by applying the composition for forming a resist underlayer film as claimed in claim 1 on the organic film and by curing the composition;
   forming a resist pattern on the resist underlayer film;
   etching the resist underlayer film using the resist pattern as a mask and using a halogen-based gas; and
   etching the organic film using the resist underlayer film after the etching as a mask and using an oxygen-containing gas.

\* \* \* \* \*